(12) United States Patent
Perner (10) Patent No.: US 6,992,475 B2
(45) Date of Patent: Jan. 31, 2006

(54) CIRCUIT AND METHOD FOR DETERMINING AT LEAST ONE VOLTAGE, CURRENT AND/OR POWER VALUE FOR AN INTEGRATED CIRCUIT

(75) Inventor: Martin Perner, München (DE)

(73) Assignee: Infineon Technologies AG, Munich (DE)

( * ) Notice: Subject to any disclaimer, the term of this patent is extended or adjusted under 35 U.S.C. 154(b) by 171 days.

(21) Appl. No.: 10/723,905

(22) Filed: Nov. 26, 2003

(65) Prior Publication Data

US 2004/0140818 A1   Jul. 22, 2004

(30) Foreign Application Priority Data

Nov. 28, 2002  (DE) ................................ 102 55 665

(51) Int. Cl.
    *G01R 31/28*    (2006.01)
    *H03K 19/00*    (2006.01)

(52) U.S. Cl. ...................... 324/158.1; 326/16; 714/733

(58) Field of Classification Search ..................... None
    See application file for complete search history.

(56) References Cited

U.S. PATENT DOCUMENTS

| | | | | |
|---|---|---|---|---|
| 4,904,883 A | * | 2/1990 | Iino et al. ................... | 327/198 |
| 5,388,265 A | * | 2/1995 | Volk ............................ | 713/322 |
| 5,726,997 A | * | 3/1998 | Teene ......................... | 714/726 |
| 5,764,655 A | * | 6/1998 | Kirihata et al. ............ | 714/733 |
| 6,177,786 B1 | | 1/2001 | Shimamori | |
| 2002/0173930 A1 | | 11/2002 | Perner | |

FOREIGN PATENT DOCUMENTS

| | | |
|---|---|---|
| DE | 101 03 658 A1 | 8/2002 |
| DE | 101 14 825 C1 | 10/2002 |

OTHER PUBLICATIONS

Tietze, U. et al.: "Halbleiter-Schaltungstechnik" [Electronic Circuits], Monostabile Kippschaltungen, Springer-Verlag, pp. 171-172, 180-181, and 188-191 and English translation: "Electronic Circuits", Springer Verlag, vol. 9, 1991, pp. 154-155, 162-163, and 170-172, no month.

Hering et al.: "Elektronik für Ingenieure" [Electronics for Engineers], Springer-Verlag, 4th Ed., 2001, pp. 618-621 and 625-626, no month.

* cited by examiner

*Primary Examiner*—Vinh Nguyen
*Assistant Examiner*—Russell M. Kobert
(74) *Attorney, Agent, or Firm*—Laurence A. Greenberg; Werner H. Stemer; Ralph E. Locher (57) ABSTRACT

A circuit and a method determine at least one electrical characteristic variable for an integrated circuit. Two or more successively produced states of a reference signal are recorded and counted in a first recording unit to produce an output voltage in a voltage generator circuit for the integrated circuit, and the number of detected states is stored. Furthermore, a time duration within which the states of the reference signal are recorded is recorded in a second recording unit. The numerical values are output via an output circuit for determining the electrical characteristic variable. At least one electrical characteristic variable such as a voltage, current and/or power value for the integrated circuit, is calculated from the number of successively recorded states of the reference signal and from the time duration. It is therefore possible to obtain accurate values relating to the operation of the integrated circuit with comparatively little complexity.

14 Claims, 7 Drawing Sheets

FIG 4A Charging Pulse Sequence when P=Constant

FIG 4B

Switch-On Transient Operation | Steady-State Operation

CIRCUIT AND METHOD FOR DETERMINING AT LEAST ONE VOLTAGE, CURRENT AND/OR POWER VALUE FOR AN INTEGRATED CIRCUIT

BACKGROUND OF THE INVENTION

Field of the Invention

The present invention relates to a circuit and to a method for determining at least one voltage, current and/or power value for an integrated circuit during its operation.

When manufacturing and characterizing new semiconductor products, it is generally necessary to determine electrical characteristic variables of the semiconductor products and/or of the integrated circuits contained in them, for qualification of the semiconductor products. In general, it is necessary to determine a housing thermal resistance (generally also referred to as Rth) in the course of a product qualification process, for example, in addition to determining the current and voltage characteristic data. In order to determine the housing thermal resistance Rth of the component housing (so-called package), the temperature difference is first determined when thermal equilibrium exists between the silicon temperature (so-called junction temperature Tjunc) and the temperature of the housing (Tcase). In addition, the power consumption is calculated by measuring the current that is drawn from a known supply voltage. The power which is consumed by the component is obtained using the equation P=UI, and the thermal resistance is calculated from Rth=(Tjunc-Tcase)/P.

Until now, the power consumption has been determined with external circuitry in order to determine the maximum load on the electrical components. While comparatively simple components with simple operating conditions do not allow a large number of operating options and thus have a defined test state, digital components such as microcontrollers or semiconductor memories may be operated in different ways, owing to the large number of operating conditions. It is thus difficult to define standard application conditions uniquely. It is often not simple to accurately investigate the current, voltage and power data in the application, owing to the poor access to the voltage supply paths for the integrated circuit when the application is in operation.

If, for example, two or more components are operated in parallel and are supplied via a voltage supply, only a mean power consumption of the components which are operated in parallel can be determined as the component mean and, in some circumstances, this reduces the measurement accuracy with respect to a typical module, owing to "spurious values". Module-specific parallel measurement of, for example, currents of two or more modules is thus impossible. A further disadvantage is that parallel measurement of two or more components in the so-called front end mode or on memory modules corrupts the determination of the power characterization of each module, since the voltage and the current level can be determined only as a mean value for a group of components during simultaneous operation. On the other hand, complex individual measurements do not allow any statistical statements to be made relating to a greater number of modules. This is associated with complex calibration of a test set and/or tedious manufacture of measurement boards and construction of the test rig.

SUMMARY OF THE INVENTION

It is accordingly an object of the invention to provide a circuit and a method for determining at least one voltage, current and/or power value for an integrated circuit that overcome the above-mentioned disadvantages of the prior art devices and methods of this general type, which allows accurate values to be obtained for operation of the integrated circuit in the application, with comparatively little complexity.

With the foregoing and other objects in view there is provided, in accordance with the invention, a test circuit for determining a voltage, a current, and/or a power value for an integrated circuit during operation of the integrated circuit. The test circuit contains a first recording unit for recording and counting at least two successively produced signal states of a reference signal used for producing an output voltage in a voltage generator circuit generating the output voltage being an internal voltage supply for the integrated circuit. A second recording unit is provided for recording signal states of the time reference signal, and an output circuit is connected to the first and second recording units. The output circuit outputs a numerical value of the signal states of the reference signal and of the time reference signal and the numerical values are used for determining an electrical characteristic variable.

The invention is based on an integrated circuit that has a voltage generator circuit in order to produce an internal voltage supply. A reference signal is used to determine an electrical characteristic variable and is used to produce an output voltage from the voltage generator circuit, with two or more successively produced states of the reference signal being recorded and counted, and the number of them being stored. Furthermore, a time duration is recorded, within which the states of the reference signal are recorded. In a corresponding manner, the circuit configuration according to the invention has a first recording unit for recording and counting of two or more successively produced states of the reference signal, as well as a second recording unit for recording a time reference signal. The at least one electrical characteristic variable is calculated in the form of a voltage, current and/or power value for the integrated circuit on the basis of the number of successively recorded states of the reference signal and on the basis of the time duration. For this purpose, an output circuit that is connected to the recording units is provided, in order to output a numerical value of signal states of the reference signal and of the time reference signal for the purpose of determining the electrical characteristic variable.

The invention is in this case based on the knowledge that fluctuations in the power consumption of the integrated circuit are reflected in a change in the reference signal for the voltage generator circuit of the integrated circuit. Fluctuations such as these can be recorded by recording and counting two or more successively produced states of the reference signal (which is used to produce the output voltage from the voltage generator circuit) within a specific time period. At the same time, a time duration is fixed for the measurement by recording of a time reference signal, so that an electrical characteristic variable can be determined on the basis of the numerical value of the signal states of the reference signal and of the time reference signal. This results in a measurement circuit that can be implemented in the integrated circuit, so that accurate values relating to operation of the integrated circuit in one application can be obtained. In this case, the electrical parameters to be determined during operation of the integrated circuit in that application are determined at the same time and on a module-specific basis. The measurement variables to be determined can be determined without any additional measurement-dependent loss of time and power, and occur in any case during the voltage stabilization process. The invention also allows characteristic electrical parameters such as the current drawn or the power consumption to be "extracted" during the operation of the integrated circuit in that application.

One advantageous embodiment of the present invention is based on the assumption of an integrated circuit that has a voltage pump circuit as the voltage generator circuit. The voltage pump circuit ensures that an internally produced voltage in the integrated circuit is kept at a constant level. In this case, buffer capacitors for the internal generators for the voltage pump circuit are charged in regular charging cycles. In the process, an increased power consumption by the integrated circuit is reflected in the rate at which the charging pulses which are required in order to stabilize the internal voltage supply. The charging pulse rate for the voltage pump circuit is accordingly (for a given external power supply) a measure of the power consumption of or the current drawn by the loads that are connected to the voltage pump circuit in the integrated circuit when the internal voltage supply is stabilized.

According to the invention, the number of charging pulses per unit time is used for voltage, current and power measurement. In a corresponding way, according to the invention, two or more successively produced states of a control signal are recorded and counted in order to produce charging pulses for the voltage pump circuit. The number of them, which corresponds to the number of charging pulses produced, is stored.

In accordance with an added feature of the invention, the first and second recording units each have a counter register for counting signal state changes of the reference signal and of the time reference signal, respectively. A multiplexer is provided and receives and is controlled by an operating mode signal. The multiplexer has a first connection providing the reference signal and a second connection providing the time reference signal. The first recording unit has at least two counter registers for respectively counting and storing the signal states of the reference signal for different operating states of the integrated circuit. The first recording unit is connected to the first connection outputting the reference signal. The second recording unit has at least two counter registers for respectively counting and storing the signal states of the time reference signal for the different operating states of the integrated circuit. The second recording unit is connected to the second connection outputting the time reference signal. The first and second recording units each have nonvolatile memory elements that can be programmed permanently, for storing a fixed value.

In accordance with an additional feature the invention, a connection is provided which outputs the reference signal. The first recording unit is connected to the connection for the reference signal which functions as a control signal for charging pulse production in the voltage generation circuit being a voltage pump circuit.

With the foregoing and other objects in view there is further provided, in accordance with the invention, a method for determining a voltage, a current, and/or a power value for an integrated circuit during operation of the integrated circuit. The method includes recording and counting at least two successively produced states of a reference signal for use in producing an output voltage in a voltage generator circuit generating the output voltage as an internal voltage supply for the integrated circuit. The number of the states of the reference signal counted is store, and a time period within which the states of the reference signal are counted is recorded. The number of the states, successively counted, of the reference signal and the time period are used for calculating at least one electrical characteristic variable of the integrated circuit. The electrical characteristic variable is a voltage, a current and/or a power value.

In accordance with an added mode of the invention, there is the step of recording and counting the states, successively produced, of the reference signal used in producing charging pulses for the voltage generation circuit being a charge pump circuit for the integrated circuit. The number of the states, successively produced, is stored, and the number corresponds to a number of the charging pulses produced.

In accordance with another mode of the invention, there are the steps of functioning in a reference operating mode with an external voltage supply having a known magnitude, determining and storing continuously the number of the charging pulses as a charging pulse reference, and recording and storing continuously the time period within which the number of the charging pulses is determined. Preferably the number of the charging pulses and the time period are determined n-times in a measurement loop, and a mean value is formed from each respective sum.

In accordance with a further mode of the invention, there are the steps of operating in a first operating mode corresponding to the reference operating mode with the external voltage supply having an unknown magnitude, determining a first number of the charging pulses in the first operating mode, recording a first time duration within which the first number of the charging pulses is determined in the first operating mode, and determining an external voltage which is applied to the integrated circuit in the first operating mode on a basis of the number of the charging pulses being a charging pulse reference, the time period being a time reference, the first time duration, the first number of the charging pulses and an external reference voltage which is known from the reference operating mode.

In accordance with an additional mode of the invention, there are the steps of stopping the counting of the charging pulses when an operating mode change occurs, and continuing the counting again when the operating mode once again corresponds to the reference operating mode.

In accordance with a further added mode of the invention, there are the steps of functioning in a second operating mode, determining a second number of the charging pulses in the second operating mode, recording a second time duration within which the second number of the charging pulses is determined in the second operating mode, and determining one of a power consumed by the integrated circuit in the second operating mode, or a current drawn on a basis of the charging pulse reference, the first time duration, the first number of the charging pulses, the second time duration and the second number of the charging pulses.

In accordance with a further additional mode of the invention, there are the steps of operating in a second operating mode for the external voltage supply which is the same as the reference operating mode, determining a second number of the charging pulses in the second operating mode, recording a second time duration within which the second number of the charging pulses is determined in the second operating mode, and determining a power consumed by the integrated circuit in the second operating mode, or a current drawn on a basis of the charging pulse reference, the time reference, the second time duration, and the second number of charging pulses.

In accordance with a concomitant mode of the invention, there are the steps of determining power consumed by the integrated circuit or a current drawn for each of at least two different operating modes, and using different counter registers for recording respectively required values, with at least one of the counter registers being permanently assigned to a respective one of the operating modes, and being activated in the respective operating mode to record a respective value.

Other features which are considered as characteristic for the invention are set forth in the appended claims.

Although the invention is illustrated and described herein as embodied in a circuit and a method for determining at least one voltage, current and/or power value for an integrated circuit, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1A:
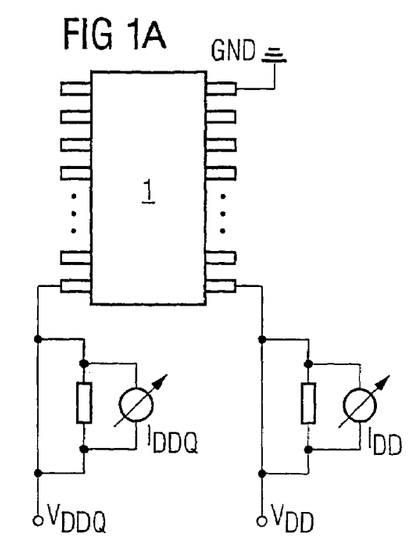
FIG. 1A is a block diagram of an integrated circuit relating to external power measurement.
Figure 1B:
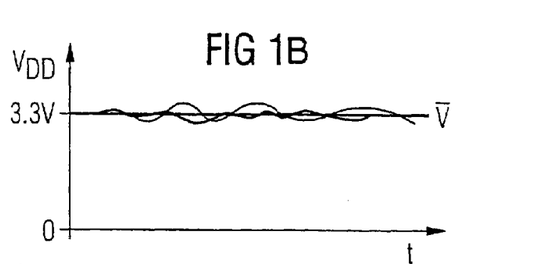
FIGS. 1B and 1C are graphs showing current and voltage profiles.
Figure 1C:
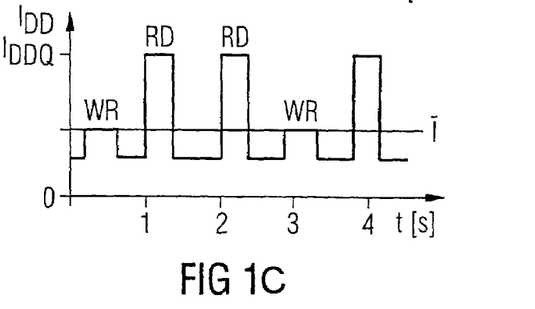

Referring now to the figures of the drawing in detail and first, particularly, to FIGS. 1A–1C thereof, there is shown an block diagram relating to an external power measurement of an integrated circuit, as well as examples of current and voltage profiles. An integrated circuit 1 in the form of a semiconductor memory chip is connected to a ground connection GND. The power consumption of the integrated circuit 1 is determined with the aid of external circuitry connected to connecting pins of the chip 1. In this case, two significant separate current paths in the integrated circuit 1 are connected to voltages VDD and VDDQ, with the respective current that is drawn, IDD and IDDQ, being measured. In this case, the currents vary depending on whether the integrated circuit 1 is in a read cycle RD or in a write cycle WR. A current mean value $\bar{I}$ and, analogously to this, a voltage mean value $\bar{V}$ are determined from these values. While a comparatively simple integrated circuit 1 with simple operating conditions does not allow many operation options, and thus has a defined test state, an integrated circuit 1 which is in contrast more complex, for example in the form of a microcontroller or semiconductor memory, can be operated in various ways, owing to the large number of operational conditions. It is thus often difficult to define standard application conditions uniquely.

Figure 2:
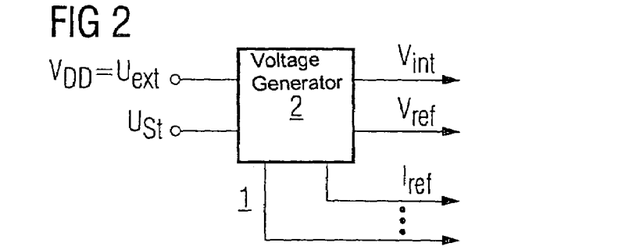
FIG. 2 is a block diagram of a voltage generator circuit.

FIG. 2 shows a schematic illustration of a voltage generator circuit that is implemented in an integrated circuit for generation of an internal voltage supply. The voltage generator circuit 2 is in this case connected to an external voltage Uext, and is controlled via a control signal Ust. The voltage generator circuit 2 produces an output voltage Vint as an internal supply voltage for the integrated circuit 1, as well as an internal reference voltage Vref. An internal reference current Iref is also produced.

Particularly in the case of complex integrated semiconductor components, an external voltage is normally transformed to a defined internal voltage. The integrated circuit is stabilized by smoothing the external voltage fluctuations and by matching the fluctuating external operating conditions to the internal guaranteed required operating values. On the basis of a reference voltage, which is governed by the material characteristics of the silicon (and its so-called bandgap reference voltage), a defined required voltage, which is appropriate for the purpose, is generated for each voltage regulator that is available in the generator network.

Essentially, two types of integrated voltage regulators are used, which increase an externally varying voltage to a second internal voltage, and at the same time smooth it. These two types are represented by voltage pumps and linear regulators. These circuits have the advantage that they can be configured without any regulation coils and are thus of interest for integration in semiconductor circuits. Linear regulators regulate any external voltage at a low internal voltage. The minimum voltage difference between the external value and the required regulated value must not be undershot since, otherwise, the regulation process will collapse. The voltage pump in contrast regulates any external voltage at an internal, higher voltage.

Figure 3:
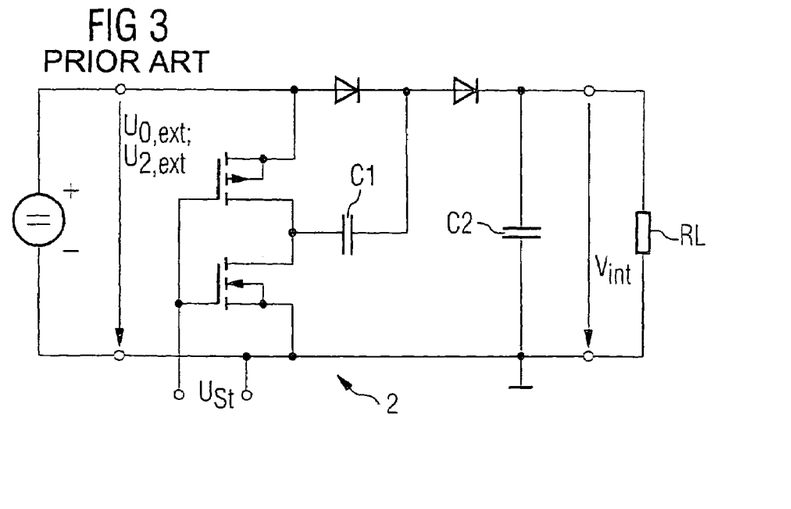
FIG. 3 is a circuit diagram of a voltage pump circuit of a known type.

FIG. 3 shows an example of the voltage pump circuit 2 of a known type. Continuously oscillating charge reversal for a capacitor supplies voltage-stabilizing energy-storage capacitors C2 with charging pulses from a transfer capacitor C1. The required voltage Vint for a load RL is tapped off across the energy-storage capacitor C2. The control signal Ust is used as the control signal for producing the charging pulses. Its variation makes it possible to react to different external voltages $U_{0,ext}$ and $U_{2,ext}$, with the internal supply voltage Vint remaining constant.

A large number of variations of both types of voltage generators are feasible in order to generate specific division ratios or required voltages as a function of a reference voltage.

The following text describes one exemplary embodiment of the present invention based on a voltage pump circuit as the voltage generator circuit, whose method of operation is ideally suited for carrying out digital current, voltage and power measurements on the integrated circuit which is supplied from the voltage generator circuit. However, the exemplary embodiment which is described in the following text can also be transferred in an analogous manner to a voltage generator circuit in the form of a linear regulator, with an appropriate reference signal for producing an output voltage from the linear regulator being used in this case as well (typical linear regulators are those which can be found, for example, in the reference by Hering, Bressler, Gutekunst: entitled "Electronik für Ingenieure" [Electronics for Engineers], Springer-Verlag, 4th edition, 2001, pages 618 to 626).

Figure 4A:
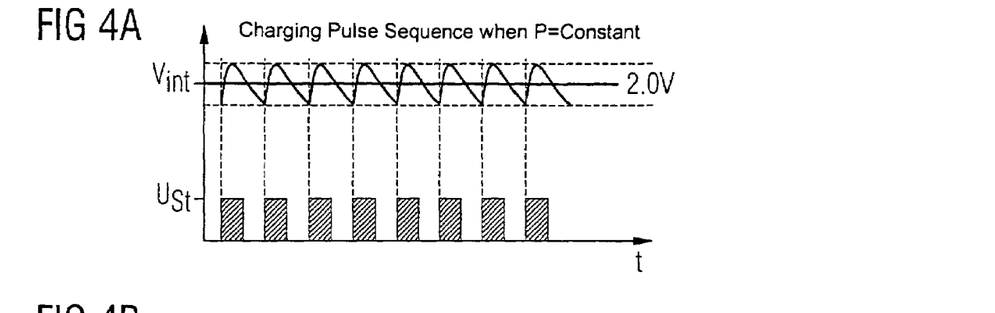
FIGS. 4A–4D are graphs showing signal profiles of the voltage pump circuit for voltage regulation using charging pulses.
Figure 4B:
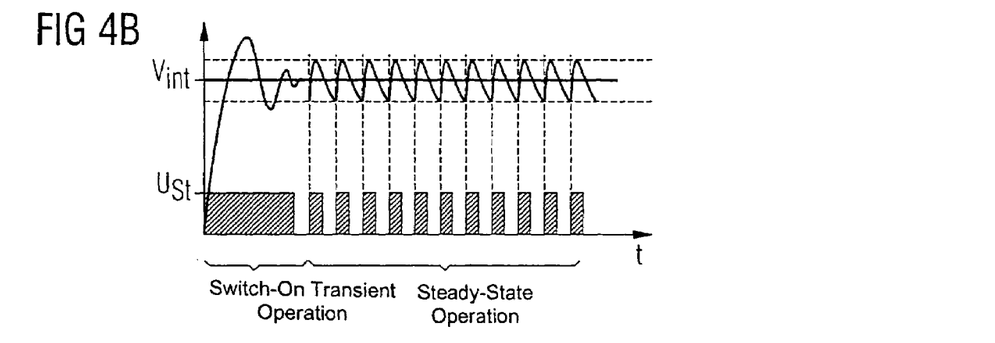
Figure 4C:
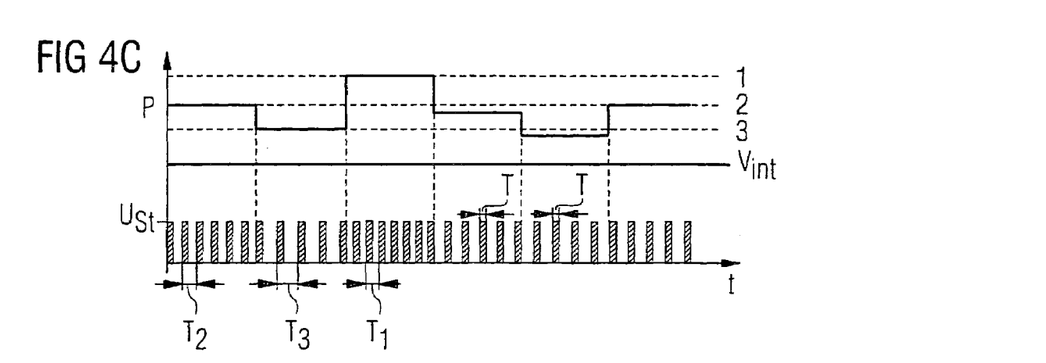
Figure 4D:
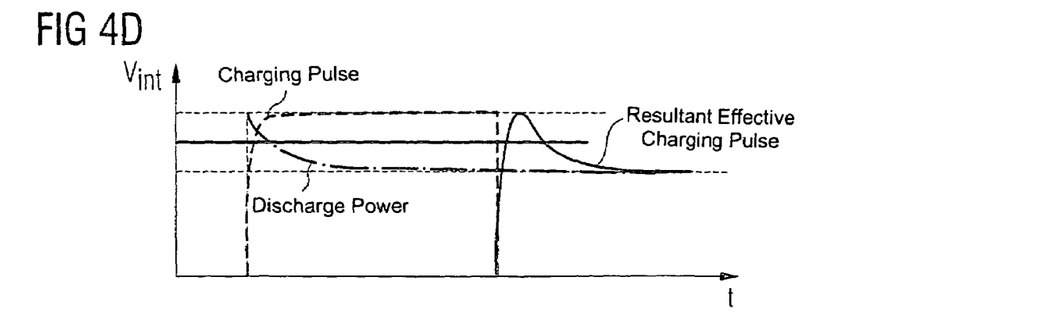

FIGS. 4A–4D shows basic signal profiles for a voltage pump circuit for voltage regulation using charging pulses. In this case, the voltage pump circuit shown by way of example operates on the pulse repetition frequency modulation principle. In this case, based on the voltage pump circuit as shown in FIG. 3, the control signal Ust with a fixed pulse duration (charging pulse duration) T is produced when a voltage Vint to be regulated has fallen below a tolerable threshold value. FIG. 4A shows a charging pulse sequence and a corresponding voltage profile for the voltage Vint for a constant power P. FIG. 4B shows profiles that illustrate switch-on transient operation and steady-state operation of the integrated circuit. The extent to which the regulated voltage falls below the minimum threshold value is dependent on the power consumption of the integrated circuit. This is illustrated by way of example in FIG. 4C, which shows a power profile of the power P and a corresponding charging pulse sequence plotted against the time t. In this case, the charging pulse repetition rate is dependent on the power consumption. The times T1, T2, T3 between the charging pulses vary depending on the power P that is consumed while, in contrast the pulse duration T remains constant.

The repetition frequency of the charging pulses is thus suitable for use as a direct measure for digital representation of the power consumption. Accordingly, with regard to the characteristics of the voltage pump circuit, it is necessary for the amount of charge produced from the charge-reversal capacitor C1 to control the output voltage across the capacitor C2 from a defined value to a defined final value in each charging cycle when in the regulated equilibrium state. The change in voltage and the charging pulse generation time are determined by active feedback, which depends on the discrepancy between the required value and the actual value of the generator level to be regulated. The analysis described so far is based on the assumption that the generator voltage to be regulated is subject to an error of only a few percent. Since the amount of charge that is transferred by the control mechanism depends on the input voltage and on the output voltage, the charge transfer (Q0) in the regulated state is approximately constant. FIG. 4B shows examples of voltage profiles of the internal supply voltage Vint, in particular a charging pulse that is produced, the discharge power and the resultant effective charging pulse.

Once the generator systems have been stabilized after the switch-on transient process at the start of operation (so-called power up), the power consumption is, to a first approximation, directly proportional to the charging pump frequency for a constant external voltage. If, by way of example, the external voltage increases or decreases by 10%, the charging pulse repetition frequency is reduced or increased in a corresponding manner, since the external voltage governs the charging of the pump capacitor. If the external voltage increases but the load is still the same, fewer charging pulses are therefore required while, if the external voltage decreases and the load is still the same, more charging pulses are required. The charging pulse repetition frequency after the switch-on transient process is, to a first approximation, inversely proportional to the applied external voltage for a constant power consumption. The number of charging pulses is related to a reference power P0:

$$P_0 = \frac{N_0}{t_0} \cdot k = \frac{N_0}{t_0}(U_{0,ext} \cdot Q_0) \quad (1)$$

In this case, $N_0$ is the number of charging pulses with a mean amount of charge $Q_0$ which would be required in the reference time $t_0$ with an applied external voltage $U_{0,ext}$ for voltage stabilization, for example, in the standby mode as the reference operating mode for an applied load with the power $P_0$ in the voltage-regulated state.

In order to determine the power actually consumed in a defined operating condition, the additional parameter $N_1$ is determined in order to carry out a normalization process with respect to a power level of 1 watt. $N_1$ is larger than $N_0$ by the factor $1\,W/P_0$, such that:

$$P_0 = 1W = \frac{N_1}{t_0} \cdot k = \frac{N_1}{t_0}(U_{0,ext} \cdot Q_0) = \frac{N_0 \cdot 1W}{P_0} \cdot \frac{1}{t_0} \cdot (U_{0,ext} \cdot Q_0) \quad (2)$$

If the power consumption $P_0$ in a known operating mode is known (reference operating mode, for example the standby mode; a suitable different operating mode, especially for volatile semiconductor memories, would, inter alia, be the self-refresh mode; in general, it is important in this case for the power consumption to be as independent of frequency as possible), but the external voltage $U_{2,ext}$ is sought from an external voltage supply whose magnitude is unknown, the measurement is repeated in the same operating conditions (that is to say in the same reference operating mode), with $N_2$ and $t_2$ being obtained as parameters, in contrast to the parameters $N_0$, $t_0$ from the previous measurement. If the power consumptions are equated, this then results in:

$$P_0 = \frac{N_0}{t_0} \cdot k = \frac{N_0}{t_0} \cdot (U_{0,ext} \cdot Q_0) = \frac{N_2}{t_2} \cdot (U_{2,ext} \cdot Q_0) \quad (3)$$

$$U_{2,ext} = U_{0,ext} \cdot \frac{N_0}{N_2} \cdot \frac{t_2}{t_0}$$

If the aim is to find the power $P_3$ in watts for any given operating mode, then:

$$P_3 = \frac{N_3}{t_3} \cdot k = \frac{N_3}{t_3} \cdot (U_{2,ext} \cdot Q_0) = \frac{N_3}{t_3} \cdot \left(U_{0,ext} \cdot \frac{N_0}{N_2} \cdot \frac{t_2}{t_0} \cdot Q_0\right) \quad (4)$$

The power measured in units of 1 watt is given by the ratio of $P_3$ to $P_1$ $$\frac{P_3}{P_1} = \frac{N_3}{t_3} \cdot \left(U_{0,ext} \cdot \frac{N_0}{N_2} \cdot \frac{t_2}{t_0} \cdot Q_0\right) \bigg/ \frac{N_1}{t_0} \cdot (U_{0,ext} \cdot Q_0) = \frac{N_3}{N_1} \cdot \frac{N_0}{N_2} \cdot \frac{t_2}{t_3} \quad (5)$$

If the voltage supply is the same as in the reference operating mode, the following relationship can be used as a simplification based on the previous equations in order to determine $P_3$:

$$\frac{P_3}{P_1} = \frac{N_3}{t_3} \cdot (U_{0,ext} \cdot Q_0) \Big/ \frac{N_1}{t_0} \cdot (U_{0,ext} \cdot Q_0) = \frac{N_3}{N_1} \cdot \frac{t_0}{t_3} \quad (6)$$

The following text describes the process for determining the reference values in the reference operating mode on the basis of a numerical example. The integrated circuit is operated with an external voltage of $U_{0,ext}$ =3.0 V. A current of Iext=166 mA is measured during load operation. In these load conditions, the generator in this case generates a charging pulse approximately every microsecond, in order to stabilize the internal voltage supply. An oscillator that is mounted on the chip is used as a time norm, and oscillates at a frequency of 1 MHz. The voltage to be regulated internally is Vint=2.0 V. $10^6$ charging pulses with a constant amount of charge are counted in a reference time $t_0$. Accordingly, on the basis of the externally determined current and voltage values, the power consumption of the integrated circuit is $P_0$=U·I=3.0·0.166 W=0.5 W. The internal voltage of Vint=2.0 V is maintained by $10^6$ charging pulses with an internal overall current level in the generator network of 250 mA. Each charging pulse accordingly produces an amount of charge of $Q_0$=250 pC within each microsecond for the voltage generator.

Figure 5:
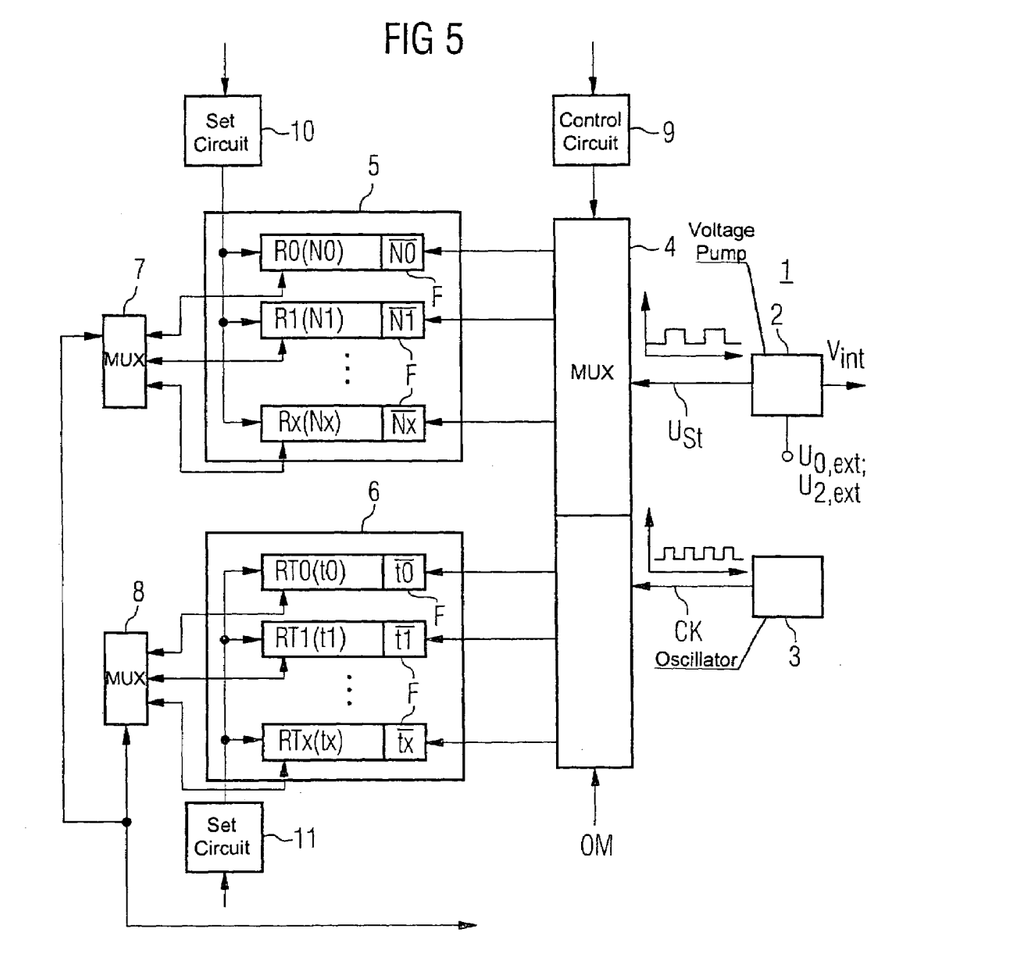
FIG. 5 is a block circuit diagram of one embodiment of a circuit for determining an electrical characteristic variable for an integrated circuit according to the invention.

FIG. 5 shows a circuit according to the invention for determining at least one electrical characteristic variable, in particular of a voltage, current and/or power value, for the integrated circuit 1. The internal supply voltage Vint is generated by the voltage pump circuit 2, to which the external voltage $U_{0,ext}$ and $U_{2,ext}$ is applied. Furthermore, an oscillator 3 produces a time reference signal in the form of the clock signal CK. The circuit shown in FIG. 5 has a first recording unit 5, which is used for recording and counting two or more successively produced states of the control signal Ust that is used as a reference signal. A second recording unit 6 is used for recording the time reference signal CK. The recording units 5, 6 respectively have counter registers R0 to Rx and RT0 to RTx for counting signal state changes of the reference signal Ust and time reference signal CK, respectively. The recording unit 5 is connected via a multiplexer 4 to the connection for the reference signal Ust, and the recording unit 6 is connected via the multiplexer 4 to the connection for the time reference signal CK.

The multiplexer 4 is controlled by the operating mode signal OM. An output circuit having multiplexers 7, 8 is used for outputting a respectively stored numerical value for signal states of the reference signal Ust and of the time reference signal CK in order to determine the electrical characteristic variable which is being looked for. The values can be set for the respective counter registers via set circuits 10, 11. The multiplexer 4 is operated via a control circuit 9, that is to say a selection is made as to which of the counter registers is activated. The control circuit 9 is also used to select when the measurement will be started and when the measurement will be stopped.

Figure 6:
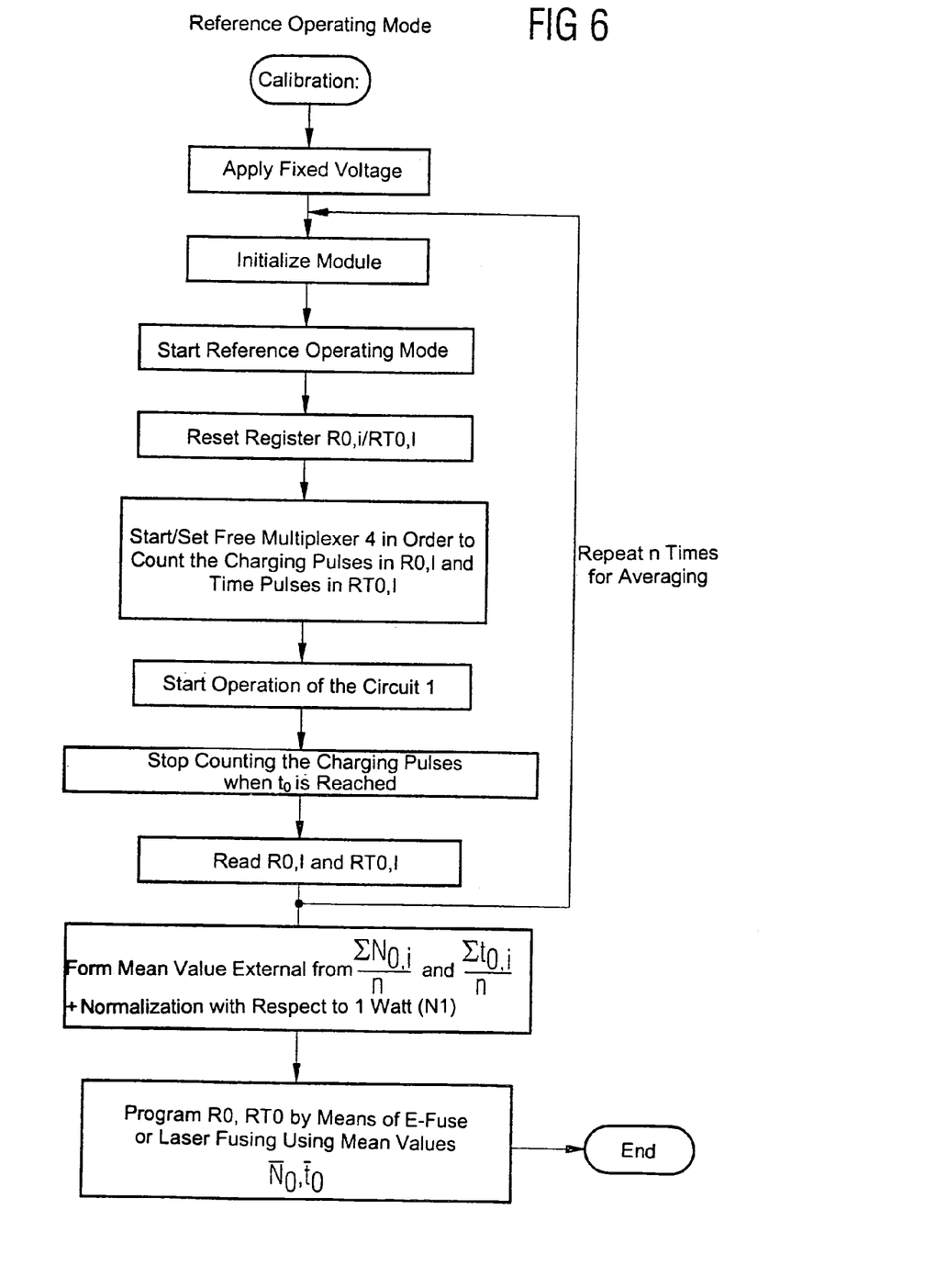
FIG. 6 is a flowchart for calibrating the circuit shown in FIG. 5 in a reference operating mode.

FIG. 6 shows a flowchart for calibrating the circuit as shown in FIG. 5 in a reference operating mode, for example a standby mode. The external voltage is applied at the start of the reference operating mode for the purpose of calibrating the circuit as shown in FIG. 5. The module is then initialized, the counter registers R0 and RT0 are reset, and the reference operating mode is operated continuously during the counting process. Controlled by the control circuit 9, the multiplexer 4 activates the counter register R0 in order to count two or more successively produced active states of the reference signal Ust, that is to say for indirect counting of the charging pulses from the voltage pump circuit 2. In the same way, the multiplexer 4 activates the counter register RT0 in order to count two or more successively produced pulses of the time reference signal CK. In this case, the counting process is stopped once the time duration $t_0$ has passed. This measurement is repeated n-times, in order to improve the measurement accuracy. In a corresponding manner, the number $N_{0,i}$ of charging pulses and the time duration $t_{0,i}$ are determined n-times in a measurement loop and the mean value $\overline{N_0},\overline{t_0}$ is formed on-chip or externally from the respective sum. In a corresponding manner, the registers R0 and RT0 have respective non-illustrated sub-registers R0,i and RT0,i for storing the respective number $N_{0,i}$ of charging pulses and the time duration $t_{0,i}$. In some circumstances, the other registers RTi and Ri may be used for averaging, which can be carried out internally or externally.

After the process as defined above of calibration of the voltage pump circuit, the values $\overline{N_0},\overline{t_0}$ as well as $N_1$ are permanently programmed into the module, for which purpose the recording units 5, 6 each have non-volatile memory elements F for example in the form of so-called electrical fuses, which can be programmed permanently. When using electrical fuses, the programming can also be carried out in the closed module and, when using laser fuses, programming can be carried out at the wafer level. The determined values $\overline{N_0},\overline{t_0}$ are stored continuously as a charging pulse reference and time reference, respectively, and can be used for further measurements. This value may be used as an aging indicator within the life of a semiconductor component, since the current and power values normally rise noticeably as a result of aging.

The following text provides a numerical example for calibration. In the reference operating mode, the external current level Iext is measured with active internal voltage regulation and with a defined applied external voltage (for example 3.0 V). A test mode is activated before the start of the external current and voltage measurement, in which test mode, controlled by the time norm oscillator 3, the charging pulses are counted within a defined time duration $t_0$. The time duration $t_0$ is, for example, 1024 times the period duration of the time reference signal CK. Once the external current and voltage measurement has been completed and the counting of the charging pulses has ended, the number of measured charging pulses $N_0$ is read and is scaled to form a number of charging pulses $N_1$, which would correspond to a power consumption of 1 watt in the measurement duration of 1024 time norm pulses with an external voltage $U_{0,ext}$ of 3.0 V in the reference operating mode. On the basis of the above numerical example, 1024 million charging pulses are accordingly measured after 1024 ms, maintaining a current draw of 250 mA. Since the number of pulses $N_0$ corresponds to a power of P=0.5 W, a total of 2048 million charging pulses is written permanently as $N_1$ to the appropriate counter register R1 for calibration of the charge pump.

Figure 7:
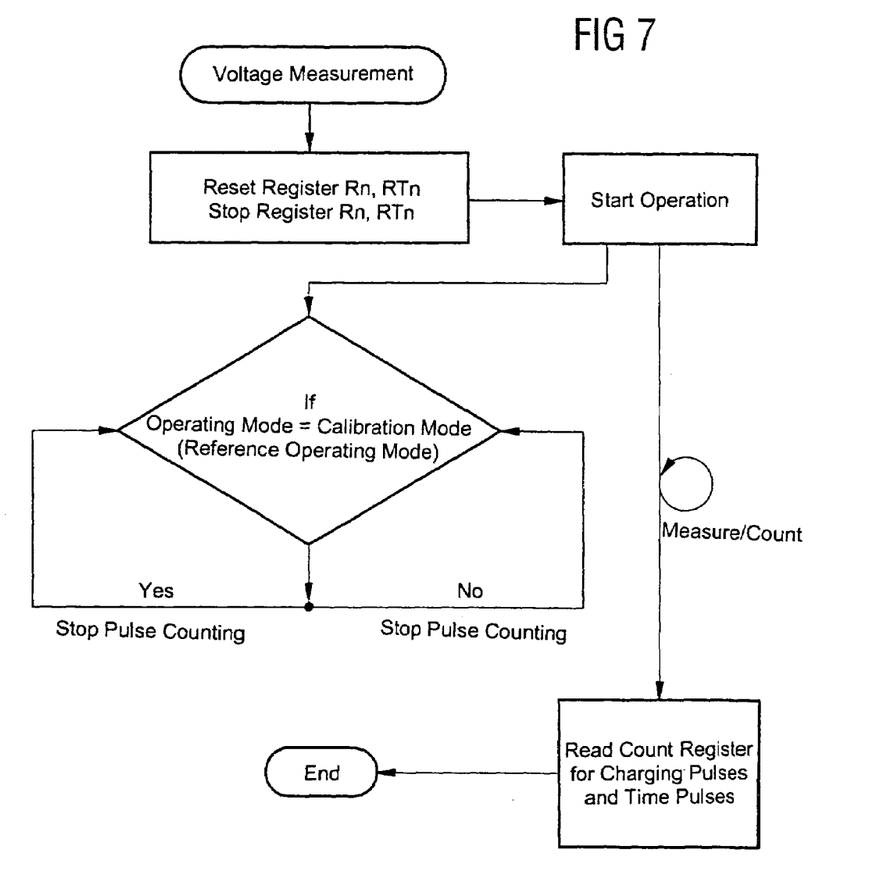
FIG. 7 is a flowchart for determining an external voltage for an integrated circuit using the circuit shown in FIG. 5.

FIG. 7 shows a flowchart for determining the external voltage for the integrated circuit with the aid of the circuit shown in FIG. 5. At the start of the measurement process, the corresponding counter registers Rn, RTn, which are intended to be used for voltage measurement, are reset. The registers Rn, RTn are then initially stopped and are kept at readiness for the counting process that will be carried out later. The operation of the integrated circuit is then started. When, in this case, the operating mode in which the integrated circuit actually is corresponds to the reference operating mode, the pulse counting is started, that is to say a first number $N_2$ of charging pulses is determined in this operating mode, and a first time duration $t_2$ is recorded, within which the first number of charging pulses $N_2$ is determined in this operating mode. As soon as the integrated circuit leaves the reference operating mode, the pulse counting process is stopped. An external voltage $U_{2,ext}$ which is applied to the integrated circuit in this operating mode is determined using equation (3) on the basis of the charging pulse reference $N_0$, the time reference $t_0$, the first time duration $t_2$, the first number of charging pulses $N_2$, and on the basis of the external reference voltage $U_{0,ext}$ which is known from the reference operating mode. The appropriate counter registers Rn, RTn are read for this purpose. As described, when an operating mode change occurs, the counting of the charging pulses is stopped, and is continued again when the operating mode once again corresponds to the reference operating mode.

Figure 8:
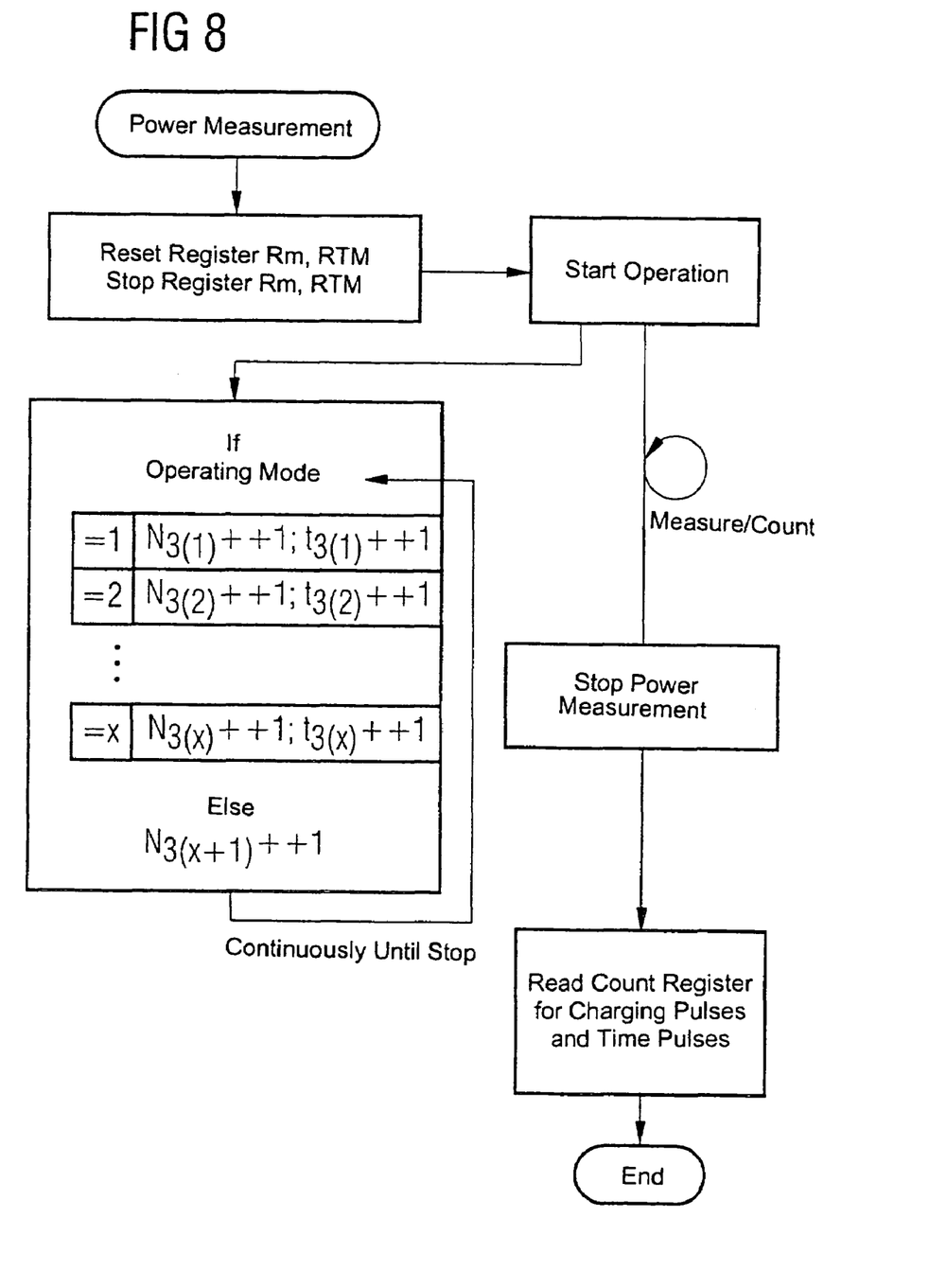
FIG. 8 is a flowchart for determining a recorded power level for the integrated circuit using the circuit shown in FIG. 5.

FIG. 8 shows a flowchart for determining the power consumed by the integrated circuit, using the circuit illustrated in FIG. 5. In an analogous manner to the voltage measurement process described above, the corresponding register Rm, RTm which is used for the power measurement is first reset, is stopped, and is kept at readiness. The operation of the integrated circuit to be measured is then started. As is shown in FIG. 8, a power that is consumed by the integrated circuit or a current that is drawn can in each case be determined for two or more different operating modes. Different counter registers are accordingly used for recording of the respectively required values, with at least one counter register being permanently associated with one of the operating modes, and being activated in this operating mode in order to record the respective value. By way of example, a second number $N_3$ of charging pulses is determined in a second operating mode (the operating mode 1) and, in addition, a second time duration $t_3$ is recorded, within which the second number $N_3$ of charging pulses is determined in the second operating mode. The power $P_3$ which is consumed by the integrated circuit in the second operating mode, or a corresponding current that is drawn is determined using equation (5) on the basis of the charging pulse reference $N_0$, the first time duration $t_2$, the first number $N_2$ of charging pulses, the second time duration $t_3$ and the second number $N_3$ of charging pulses. Depending on the operating mode to be evaluated, the respectively associated counter registers for the charging pulses and time pulses are read for this purpose.

As is shown in FIG. 8, an effectively parallel measurement is carried out for two or more operating modes, with the count of the respectively associated counter register being increased depending on the present operating mode (expressed by, for example, $N_{3(1)}$++1, $t_{3(1)}$++1). By way of example, the count $N_{3(2)}$ or $t_{3(2)}$ is increased in the operating mode 2 when the circuit is in the appropriate operating mode.

The measurement process as shown in FIG. 6 can be simplified if an external voltage supply which is the same as that for the reference operating mode is applied in the operating mode in which the power is intended to be measured. The power $P_3$ is determined using equation (6), on the basis of the charging pulse reference $N_0$, $N_1$, the time reference $t_0$, the second time duration $t_3$ and the second number $N_3$ of charging pulses.

Figure 9:
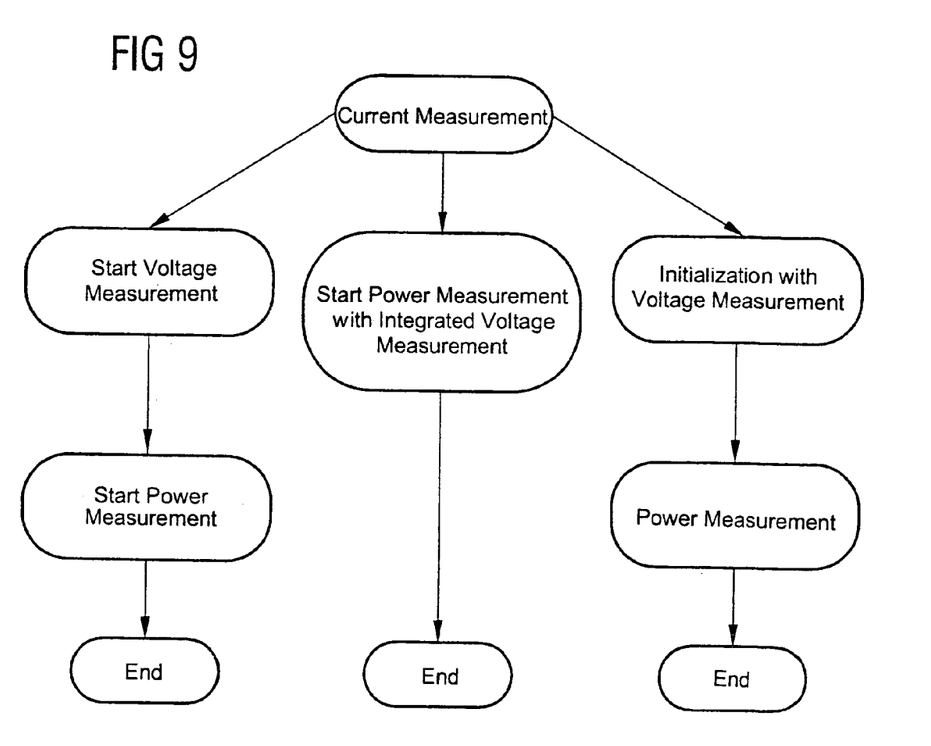
FIG. 9 is a flowchart for determining the recorded current for an integrated circuit.

FIG. 9 shows a flowchart for determining a current that is drawn by an integrated circuit. In this case, the current measurement can be carried out in three different ways. For very accurate measurement purposes, a voltage measurement is always carried out first, after which a power measurement is carried out, from which the current that is drawn can be calculated. For the situation where a less accurate measurement is required, the power measurement is carried out immediately, with the voltage measurement being integrated (as is shown in a profile in FIG. 7) in the power measurement. Therefore a voltage measurement is carried out whenever the integrated circuit is in a reference operating mode while, otherwise, the process continues with the power measurement, on the basis of previous voltage values. For the situation where the externally applied voltage varies comparatively only slightly, a voltage measurement is carried out with initialization of the integrated circuit, after which a power measurement is carried out continuously.

Since, in contrast to the operating current, the operating voltage does not depend on the operating mode of the module, it is sufficient to carry out the two measurements successively when a power determination and a current level determination are intended to be carried out in unknown operating conditions. This makes it possible to determine the electrical parameters even in applications within unknown operating conditions.

If additional voltage sources determine the power consumption of the integrated circuit, these current paths must be switched off via a test mode, so that the only governing factor is the voltage generator for the overall power supply, with its charging pulses being registered.

In a further embodiment of the invention, two measurement circuits can be used in parallel to determine the current level and the voltage during operation. Both measurement circuits must be calibrated in the same described manner. While, as described above, the first circuit measures the current level, the second measurement circuit measures the charging pulses only when the module is in the desired operating mode, in which the power calibration has also been carried out. Since, during use, the module is briefly in the standby mode or self-refresh mode owing to the initialization during the power-up phase, a standard voltage measurement as well as a power measurement can be carried out automatically during the initialization process.

The invention makes it possible to use a module on which the circuit according to the invention for determination of electrical characteristic variables is integrated as an active "sample" for recording the external voltage supply operating conditions. This allows malfunctions in the voltage supply to be recorded, in which case the voltage operating state can be recorded together with the fault situation.

During operation of the integrated circuit in the application, the determined electrical operating parameters can be checked continuously via pins, which need to be defined, when the operating monitor function is activated. In this case, one particular advantage of the present invention is that checking the charging pulse count makes it possible to quickly identify a voltage generator problem, even in generator subnetworks, which would otherwise normally be possible only by opening the module and by so-called picoprobes on the module.

Aging of the module, which can be identified by the reference current that is drawn being to high compared with the reference current that was drawn at the time of manufacture, can be identified if another reference operating mode measurement is carried out after years of operation.

I claim:

1. A test circuit for determining at least one of a voltage, a current, and a power value for an integrated circuit during operation of the integrated circuit, the test circuit comprising:

a first recording unit for recording and counting at least two successively produced signal states of a reference signal used for producing an output voltage in a voltage generator circuit generating the output voltage being an internal voltage supply for the integrated circuit;

a second recording unit for recording signal states of the time reference signal; and an output circuit connected to said first and second recording units, said output circuit outputting a numerical value of the signal states of the reference signal and of the time reference signal for use in determining an electrical characteristic variable.

2. The circuit according to claim 1, wherein said first and second recording units each have a counter register for counting signal state changes of the reference signal and of the time reference signal, respectively.

3. The circuit according to claim 1,
further comprising a multiplexer receiving and controlled by an operating mode signal, said multiplexer having a first connection providing the reference signal and a second connection providing the time reference signal;
wherein said first recording unit has at least two counter registers for respective counting and storing the signal states of the reference signal for different operating states of the integrated circuit, said first recording unit is connected to said first connection outputting the reference signal; and
wherein said second recording unit has at least two counter registers for respective counting and storing the signal states of the time reference signal for the different operating states of the integrated circuit, said second recording unit is connected to said second connection outputting the time reference signal.

4. The circuit according to claim 1, wherein said first and second recording units each have nonvolatile memory elements which can be programmed permanently, for storing a fixed value.

5. The circuit according to claim 1, further comprising a connection providing the reference signal, said first recording unit is connected to said connection for the reference signal functioning as a control signal for charging pulse production in the voltage generation circuit being a voltage pump circuit.

6. A method for determining at least one of a voltage, a current, and a power value for an integrated circuit during operation of the integrated circuit, which comprises the steps of:
recording and counting at least two successively produced states of a reference signal for use in producing an output voltage in a voltage generator circuit generating the output voltage as an internal voltage supply for the integrated circuit;
storing a number of the states of the reference signal counted;
recording a time period within which the states of the reference signal are recorded; and
using the number of the states, successively counted, of the reference signal and the time period for calculating at least one electrical characteristic variable of the integrated circuit, the electrical characteristic variable being selected from the group consisting of the voltage, the current and the power value.

7. The method according to claim 6, which further comprises recording and counting the states, successively produced, of the reference signal used in producing charging pulses for the voltage generation circuit being a charge pump circuit for the integrated circuit, and the number of the states, successively produced, is stored, with the number corresponding to a number of the charging pulses produced.

8. The method according to claim 7, which further comprises:
functioning in a reference operating mode with an external voltage supply having a known magnitude;
determining and storing continuously the number of the charging pulses as a charging pulse reference; and
recording and storing continuously the time period within which the number of the charging pulses is determined.

9. The method according to claim 8, which further comprises:
determining the number of the charging pulses and the time period n-times in a measurement loop; and
forming a mean value from their respective sum.

10. The method according to claim 8, which further comprises:
operating in a first operating mode corresponding to the reference operating mode with the external voltage supply having an unknown magnitude;
determining a first number of the charging pulses in the first operating mode;
recording a first time duration within which the first number of the charging pulses is determined in the first operating mode; and
determining an external voltage which is applied to the integrated circuit in the first operating mode on a basis of the number of the charging pulses being a charging pulse reference, the time period being a time reference, the first time duration, the first number of the charging pulses and an external reference voltage which is known from the reference operating mode.

11. The method according to claim 10, which further comprises:
stopping a counting of the charging pulses when an operating mode change occurs; and
continuing the counting again when the operating mode once again corresponds to the reference operating mode.

12. The method according to claim 10, which further comprises:
functioning in a second operating mode;
determining a second number of the charging pulses in the second operating mode;
recording a second time duration within which the second number of the charging pulses is determined in the second operating mode; and
determining one of a power consumed by the integrated circuit in the second operating mode, or a current drawn on a basis of the charging pulse reference, the first time duration, the first number of the charging pulses, the second time duration and the second number of the charging pulses.

13. The method according to claim 12, which further comprises:
determining power consumed by the integrated circuit or a current drawn for each of at least two different operating modes; and
using different counter registers for recording respectively required values, with at least one of the counter registers being permanently assigned to a respective one of the operating modes, and being activated in the respective operating mode to record a respective value.

14. The method according to claim 10, which further comprises:
operating in a second operating mode for the external voltage supply which is the same as the reference operating mode;
determining a second number of the charging pulses in the second operating mode;
recording a second time duration within which the second number of the charging pulses is determined in the second operating mode; and
determining a power consumed by the integrated circuit in the second operating mode, or a current drawn on a basis of the charging pulse reference, the time reference, the second time duration, and the second number of charging pulses.

* * * * *